(12) United States Patent
Chang

(10) Patent No.: US 8,597,870 B2
(45) Date of Patent: *Dec. 3, 2013

(54) TARC MATERIAL FOR IMMERSION WATERMARK REDUCTION

(75) Inventor: Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/525,796

(22) Filed: Jun. 18, 2012

(65) Prior Publication Data

US 2012/0258400 A1   Oct. 11, 2012

Related U.S. Application Data

(60) Continuation of application No. 13/177,741, filed on Jul. 7, 2011, now Pat. No. 8,202,680, which is a division of application No. 11/324,588, filed on Jan. 3, 2006, now Pat. No. 7,993,808.

(60) Provisional application No. 60/722,316, filed on Sep. 30, 2005, provisional application No. 60/722,646, filed on Sep. 30, 2005.

(51) Int. Cl.
*G03F 7/00* (2006.01)
*G03F 7/11* (2006.01)

(52) U.S. Cl.
USPC .......... 430/270.1; 430/271.1; 430/273.1; 430/910; 430/311

(58) Field of Classification Search
USPC ............ 430/270.1, 271.1, 273.1, 910, 311
See application file for complete search history.

(56) References Cited

U.S. PATENT DOCUMENTS

| 5,212,047 | A | 5/1993 | Hertler et al. |
| 5,658,706 | A | 8/1997 | Niki et al. |
| 6,153,349 | A | 11/2000 | Ichikawa et al. |
| 6,713,236 | B2 | 3/2004 | Chen |
| 6,781,670 | B2 | 8/2004 | Krautschik |
| 6,788,477 | B2 | 9/2004 | Lin |
| 6,828,079 | B2 | 12/2004 | Suetsugu et al. |
| 6,849,378 | B2 | 2/2005 | Choi et al. |
| 6,929,891 | B2 | 8/2005 | Rushkin et al. |
| 7,090,963 | B2 | 8/2006 | Medeiros et al. |
| 7,125,643 | B2 | 10/2006 | Harada et al. |

(Continued)

FOREIGN PATENT DOCUMENTS

| CN | 1235281 | 11/1999 |
| CN | 1407405 | 4/2003 |

(Continued)

OTHER PUBLICATIONS

Netherlands Patent Office, Novelty Search Report, Apr. 10, 2007, Application No. 20062128576, 9 pgs.

(Continued)

*Primary Examiner* — Amanda C. Walke
(74) *Attorney, Agent, or Firm* — Haynes and Boone, LLP

(57) ABSTRACT

A coating material for use during a lithography process. In an example, a coating material disposed on a material layer includes a polymer and a quencher catcher chemically bonded to the polymer. The quencher catcher substantially neutralizes any quencher that diffuses into the coating material from the material layer.

20 Claims, 3 Drawing Sheets

(56) References Cited

U.S. PATENT DOCUMENTS

| | | |
|---|---|---|
| 7,169,529 B2 | 1/2007 | Shibuya |
| 7,192,681 B2 | 3/2007 | Fujimori |
| 7,264,918 B2 | 9/2007 | Endo et al. |
| 7,384,730 B2 | 6/2008 | Hata et al. |
| 7,396,633 B2 | 7/2008 | Nagahara et al. |
| 7,419,759 B2 | 9/2008 | Kim et al. |
| 7,459,264 B2 | 12/2008 | Kawamura et al. |
| 7,461,119 B2 | 12/2008 | Mukundan et al. |
| 7,463,330 B2 | 12/2008 | Streefkerk et al. |
| 7,473,512 B2 | 1/2009 | Houlihan et al. |
| 7,479,361 B2 | 1/2009 | Nagahara et al. |
| 7,498,118 B2 | 3/2009 | Kim |
| 7,524,618 B2 | 4/2009 | Ito |
| 7,678,527 B2 | 3/2010 | Meagley et al. |
| 7,700,267 B2 | 4/2010 | Yeo et al. |
| 7,804,574 B2 | 9/2010 | Streefkerk et al. |
| 7,892,722 B2 | 2/2011 | Inabe et al. |
| 7,927,779 B2 | 4/2011 | Chang |
| 8,202,680 B2 * | 6/2012 | Chang ..................... 430/270.1 |
| 2005/0029492 A1 | 2/2005 | Subawalla et al. |
| 2005/0051930 A1 | 3/2005 | Kawakami et al. |
| 2005/0202351 A1 | 9/2005 | Houlihan et al. |
| 2006/0068318 A1 | 3/2006 | Meagley et al. |
| 2007/0002296 A1 | 1/2007 | Chang |
| 2007/0006405 A1 | 1/2007 | Feng et al. |
| 2007/0031760 A1 | 2/2007 | Chang et al. |
| 2007/0077517 A1 | 4/2007 | Chang |
| 2008/0076038 A1 | 3/2008 | Chang |
| 2011/0262871 A1 | 10/2011 | Chang |

FOREIGN PATENT DOCUMENTS

| | | |
|---|---|---|
| EP | 1033624 | 9/1999 |
| EP | 1522894 | 4/2005 |
| EP | 1601008 | 11/2005 |
| EP | 1662323 | 5/2006 |
| JP | 07134419 | 5/1995 |
| JP | 07146558 | 6/1995 |
| JP | 09160244 | 6/1997 |
| JP | 2001109142 | 4/2001 |
| JP | 2001337448 | 12/2001 |
| JP | 2003140360 | 5/2003 |
| JP | 2003167345 | 6/2003 |
| JP | 2005081302 | 3/2005 |
| JP | 2005101487 | 4/2005 |
| JP | 2005101498 | 4/2005 |
| JP | 2005128455 | 5/2005 |
| JP | 2005157259 | 6/2005 |
| JP | 2005264131 | 9/2005 |
| JP | 2006024692 | 1/2006 |
| JP | 2006048029 | 2/2006 |
| JP | 2006124957 | 5/2006 |
| JP | 2006157228 | 6/2006 |
| JP | 2006198897 | 8/2006 |
| JP | 2006276851 | 10/2006 |
| JP | 2006309245 | 11/2006 |
| JP | 2007219472 | 8/2007 |
| JP | 2007304537 | 11/2007 |
| JP | 2007304545 | 11/2007 |
| TW | 581930 | 4/2004 |
| TW | 233539 | 6/2005 |
| TW | 200613433 | 5/2006 |
| WO | WO-0291084 | 5/2002 |
| WO | WO-2004079800 | 9/2004 |
| WO | WO-2004081666 | 9/2004 |
| WO | WO-2004088429 | 10/2004 |
| WO | WO-2005019937 | 3/2005 |
| WO | WO-2005024325 | 3/2005 |
| WO | WO-2005081063 | 9/2005 |
| WO | WO-2005088397 | 9/2005 |
| WO | WO-2005013007 | 10/2005 |

OTHER PUBLICATIONS

Japanese Patent Office, Notice of Reasons for Refusal, Jan. 13, 2009, Application 2006186926, 12 pgs.
Netherlands Patent Office, Novelty Search Report, Jun. 28, 2006 Application No. 1032068, 5 pgs.
Japanese Patent Office, Office Action dated Jul. 6, 2009, Application No. 20062128576, 7 pgs.
Chinese Patent Office, Office Action dated Jun. 26, 2009, Application No. 2006101524283, 4 pgs.
Chinese Patent Office, Office Action dated May 22, 2009, Application No. 2006101524298, 5 pgs.
German Patent Office, Office Action dated Apr. 15, 2009, Application No. 1020060464532-51, 17 pgs.
Jung, et al., "Top Antireflective Coating Process for Immersion Lithography," Advances in Resist Technology and Processing XXII, Bellingham, WA, Proceedings of SPIE vol. 5753, p. 519-526.
Japanese Patent Office, Office Action dated Nov. 9, 2009, Application No. 2006212576, 2 pgs.
Chinese Patent Office, Office Action dated Dec. 11, 2009, Application No. 2006101524283, 63 pgs.
Japanese Patent Office, Office Action dated Nov. 24, 2009, Application No. 2007146915, 12 pgs.
Israeli Patent Office, Office Action dated Feb. 9, 2010, Application No. 178317, 4 pgs.
Taiwanese Patent Office, Office Action dated May 19, 2010, Application 200910150015.5, 5 pgs.
French Patent Office, Search Report dated Jun. 22, 2010, Application No. 0608609, 8 pgs.
Taiwanese Patent Office, Office Action dated Aug. 17, 2010, Application No. 095123517, 5 pgs.
Japanese Patent Office, Office Action dated Sep. 28, 2010, Application No. 2007-146915, 3 pgs.
Taiwanese Patent Office, Office Action dated Nov. 24, 2010, Application No. 095123517, 4 pgs.
Taiwanese Patent Office, Office Action dated Mar. 2, 2011, Application No. 096114844, 5 pgs.

* cited by examiner

TARC MATERIAL FOR IMMERSION WATERMARK REDUCTION

CROSS-REFERENCE TO RELATED APPLICATIONS

This application is a continuation of U.S. patent application Ser. No. 13/177,741, filed Jul. 7, 2011, issued as U.S. Pat. No. 8,202,680 which is a divisional of U.S. patent application Ser. No. 11/324,588, filed Jan. 3, 2006, issued as U.S. Pat. No. 7,993,808 on Aug. 9, 2011, which claims priority to U.S. Provisional Patent Application Ser. No. 60/722,316, filed Sep. 30, 2005, and U.S. Provisional Patent Application Ser. No. 60/722,646, filed Sep. 30, 2005, all of which the entire disclosures are incorporated herein by reference.

BACKGROUND

As semiconductor fabrication technologies continually progress to smaller feature sizes such as 65 nanometers, 45 nanometers, and below, immersion lithography processes are being adopted. However, immersion lithography processes induce water drop residue after an exposure process. Such water drop residue can cause water mark defects and therefore degrade or even cause failures during semiconductor fabrication.

What is needed is an improved material for the substrate being exposed, such as a top anti-reflection coating (TARC), wherein the damage caused by water mark defects is prevented and/or reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
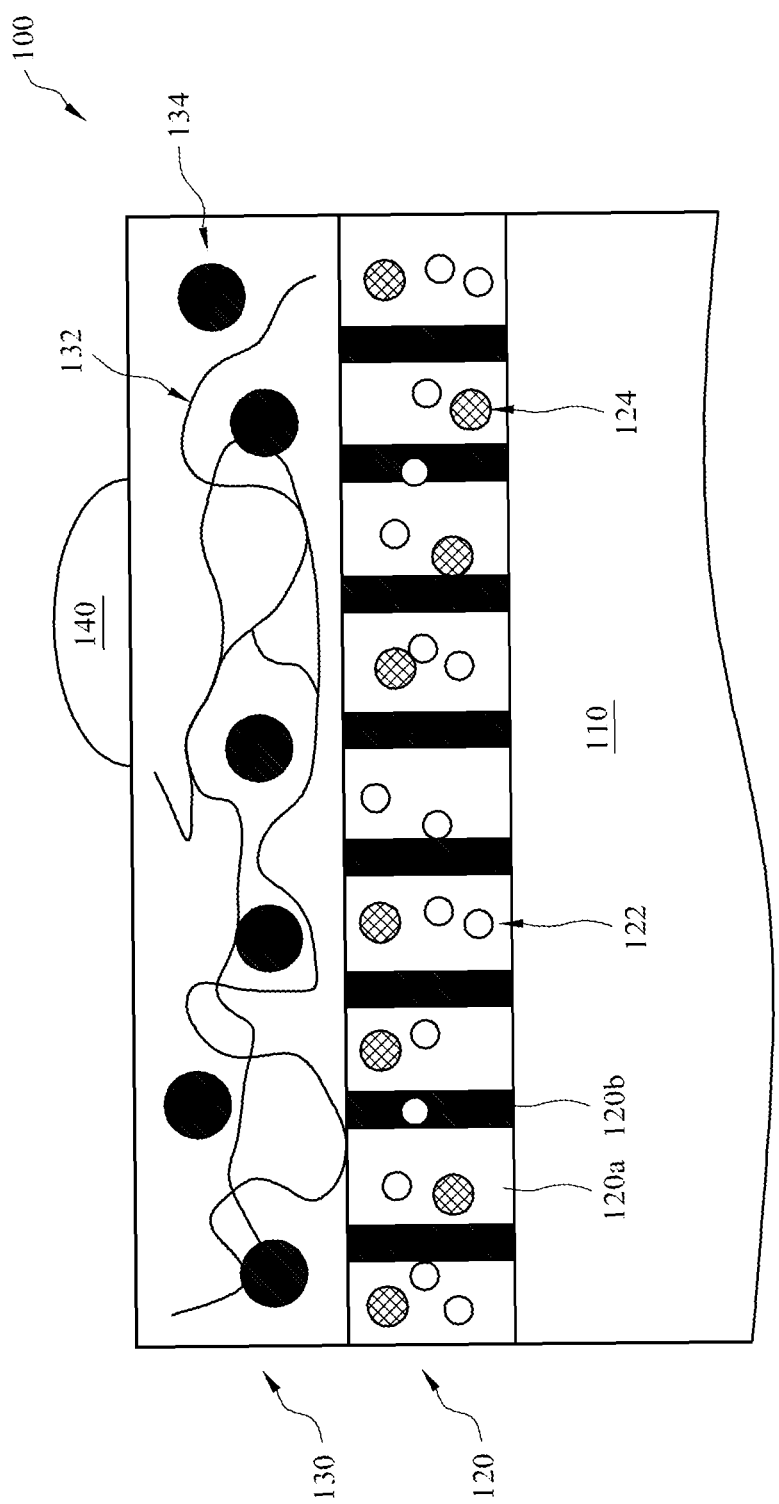
FIG. 1 illustrates a sectional view of an exemplary semiconductor device having a coating material layer for use during an immersion lithography exposing process.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a sectional view of a semiconductor device 100, such as a semiconductor wafer. The semiconductor device 100 includes a substrate 110 having an organic bottom antireflective coating (BARC) layer, an inorganic bottom anti reflective layer, an etch resistance organic layer, an adhesion enhancement organic layer, various doped regions, dielectric features, and/or multilevel interconnects. In the present embodiment, the substrate includes silicon, but other embodiments may include Ge, SiGe, GaAs, and so forth. The substrate may alternatively include a non-semiconductor material such as a glass plate for thin-film-transistor liquid crystal display (TFT-LCD) devices. The semiconductor device 100 may further include one or more material layers to be patterned.

The semiconductor device 100 includes a photosensitive layer (photoresist or resist) 120. In the present example, the resist layer 120 may have a thickness ranging between about 50 angstroms and 5000 angstroms. In another example, the resist layer 120 may have a thickness ranging between about 500 angstroms and 2000 angstroms. The resist layer 120 utilizes a chemical amplification (CA) resist material. The resist layer 120 includes a polymer material that turns soluble to a developer, such as a base solution, when the polymer is reacted with acid. The resist 120 further includes a solvent filling inside the polymer. The solvent may be partially evaporated off during a baking process. The resist 120 also includes a photo-acid generator (PAG) 122 material. The PAG molecules are distributed inside the solvent and polymer. When absorbing photo energy, the PAG 122 decomposes and forms a small amount of acid. The PAG 122 may have a concentration ranging between about 1% and 15% weight of the resist polymer.

In the present embodiment, the resist 120 also includes a quencher material 124 that distributes inside the solvent and polymer. The quencher 124 is a base type and is capable of substantially neutralizing acid. Collectively or alternatively, the quencher may inhibit other active components of the resist 120, such as inhibiting PAG from reaction. The quencher 124 may have a concentration larger than about 1% wt of the resist polymer. The quencher 124 may alternatively have a concentration about one fourth of the concentration of the PAG 122 by weight before the exposing process. In one example, each molecule of the quencher 124 includes a nitrogen atom having an unpaired electron that is capable of neutralizing an acid. The resist layer 120 may be formed on the substrate 110 by a method such as spin-on coating. Other processes involved may include a soft baking after the coating process.

In the present embodiment, a coating material layer 130 overlies the resist layer 120. The coating material 130 includes a polymer 132 that is substantially insoluble to an immersion fluid. In one example, the polymer 132 contains fluoride. The coating material 130 includes an acid 134. The coating material 130 may have a pH value below about 5. The acid 134 may be chemically bonded to the polymer 132. The chemically bonded acid 134 and the polymer 132 may form a copolymer that has an organic acid functional group. The organic acid functional group may include a carboxylic group, hydroxyl group, a thiol group, an enol group, a phenol group, a sulfonyl acid group, a $SO_2OH$ group, or combinations thereof. The acid 134 may be alternatively distributed in the coating material layer 130 mixed to the polymer. The acid for this purpose may include surfactant, additive, buffer, and other suitable chemicals. The acid additives may include organic acid or inorganic acid. The organic acid may be selected from the group consisting of a carboxylic group, hydroxyl group, a thiol group, an enol group, a phenol group, a sulfonyl acid group, a $SO_2OH$ group, and combinations thereof. The inorganic acid may be selected from the group consisting of perchloric acid, hydrogen iodide, hydrogen bromide, hydrogen chloride, nitric acid, thiocyanic acid, chloric acid, iodic acid, hypophosphorous acid, hydrogen fluoride, nitrous acid, cyanic acid, hydrazoic acid, hypochlorous acid, hypobromous acid, hydrocyanic acid, hypoiodous acid, sulfuric acid, chromic acid, sulfurous acid, phosphoric acid, phosphorous acid, pyrophosphoric acid, carbonic acid, hydrogen sulfide, boric acid, and combinations thereof. In another example, the organic acid may include a PAG in the coating material layer, bonded or not bonded to the polymer 132. The PAG in the coating material 130 may be transformed into an acid at an exposing process such as an exposing process for resist patterning. The coating material layer 130 may further include solvent in the polymer. The solvent may include perfluoro solvent such as hydrofluroether $C_4F_9OCH_3$. The solvent may alternatively include PGME/PGMEA mixture solvent. The mixture ratio may range between about 10/1 to 1/10. For example, the mixture ratio is about 7/3 in one example. The solvent may include alcohol solvent, such as cyclohexanol, butanol, iso-butanol, pentanol, or iso-pentanol. The solvent may alternatively include water-based solvent.

Figure 2:
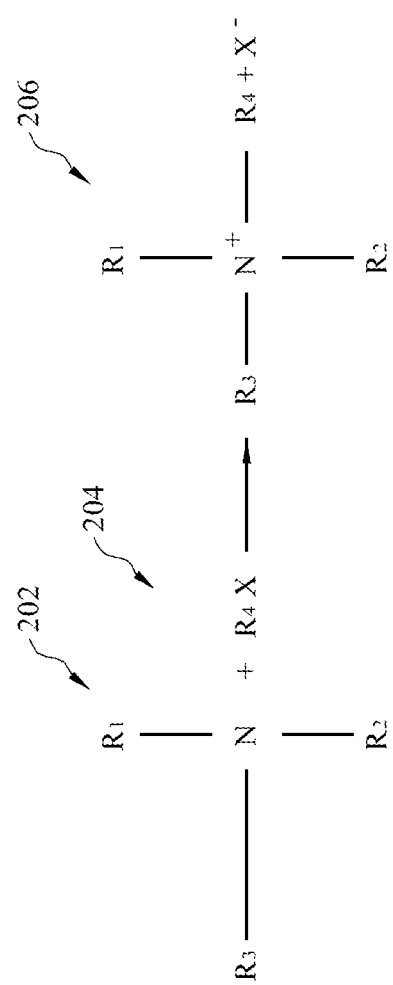
FIG. 2 illustrates a schematic view of an exemplary reaction between a quencher and a chelate compound.

Alternatively, the coating material 130 may include a chelate compound instead of an acid. The chelate compound is capable to react with the quencher and chemically bond therewith. The reaction between the chelate compound and the quencher may lead to a larger molecule, a reduced mobility of the quencher, and/or may inactivate the quencher by neutralizing the nitrogen of the quencher, for example. The chelate compound may be chemically bonded to the polymer. Thus the reaction between the quencher and the chelate compound can lead to that the quencher is bonded to the polymer. For example, FIG. 2 illustrates a schematic view of an example of a reaction between a quencher and a chelate compound. A quencher 202 having a tertiary amine may react with a chelate compound 204 having a halogenalkane to form a quaternary ammonium salt 206.

Referring again to FIG. 1, the coating layer may be integral to a top antireflective coating layer (TARC) with an enhanced reflection to a radiation energy during an exposing process. The coating material layer 130 may be alternatively formed above or below a separate TARC layer. The coating material layer 130 may include a multiple layer structure (composite layer). For example, the coating material layer 130 may include a dual layer structure having a first coating layer and a second coating layer disposed on the first coating layer. The first and second coating layers may include different materials tuned for intended functions. The first coating layer may be disposed on top of the resist layer 120 and may be designed to function as a quencher catch layer to neutralize the quencher diffused from the resist layer 120. To avoid resist intermixing during the coating, the solvent of the first coating layer may be different from that of the resist layer. For example, if the resist layer is a PGME/PGMEA solvent, the first coating layer may utilize an alcohol solvent. The second coating layer may be a polymer network cross-linked at a baking process, or may utilize a normal solvent such as PGME/PGMEA solvent to eliminate intermixing. Alternatively, the first coating layer may be cross-linked and the second coating layer may utilize a normal solvent such as a PGME/PGMEA solvent. The second coating layer may be designed to isolate the resist layer from the immersion fluid, eliminating fluid uptake from the immersion fluid, such as de-ionized water (DIW). Collectively or alternatively, the second coating layer may be designed to prevent resist composition leaching from the resist layer 120. The function of the first and second coating layers may be switched to make the first layer as an isolation and the second layer as a quencher neutralizer.

The coating material layer 130 may be substantially soluble in a base solution, a developing solution, or a solvent. An example of the base solution may include a tetramethylammonium hydroxide (TMAH) solution. An example of the solvent may include cyclohexanol, butanol, iso-butanol, pentanol, or iso-pentanol. The resist layer 120 may include a solution such as PGMEA or PGME. The coating material layer 130 may be spin-on coated thereon and may be further baked. The baking process is integral to the baking process of the resist layer 120 or independent from resist layer baking.

During an exposing process, the resist layer 120 and the coating material layer 130 are exposed to a radiation energy such as deep ultra-violet (DUV) through a photomask (mask or reticle) having a predefined pattern and an immersion fluid, resulting a resist pattern having a plurality of unexposed regions such as unexposed features 120a and a plurality of exposed regions such as exposed features 120b. The radiation energy may include 248 nm beam by Krypton Fluoride (KrF) excimer lasers or 193 nm beam by Argon Fluoride (ArF) excimer lasers. The immersion fluid may include de-ionized water (DI water or DIW). The immersion fluid may further include chemical additives such as an acid. The immersion fluid may alternatively include other suitable fluid having an index of refraction higher than 1.44, the index of refraction of water. During an exposing process, water drop residue, such as an exemplary water drop 140, may be left on the coating material layer after the exposing process.

In previous immersion lithography patterning processes, the water drop residue may cause problems such as forming a watermark. When a water drop is left on a resist layer, the water drop provides a path to PAG and quencher. The quencher in the unexposed resist region may diffuse into the water drop and further diffuse into the exposed resist region, neutralize photo generated acid, and reduce exposing efficiency in these exposed areas. Furthermore, the exposed PAG is decomposed as PAG anion and acid, which is more soluble to water than unexposed PAG. The photo generated acid may also diffuse into the water drop with additional effect such that these exposed areas may have reduced photo generated acid. These exposed areas of the resist layer thus may have insufficient photo generated acid to induce a cascade of chemical transformations (acid amplification) after the exposing process step, and may not be fully soluble in developing solution at a developing process step. Thus, an unexpected T-top resist feature (watermark) may be formed on the exposed regions of the resist layer in which the top resist material of the exposed region are not soluble in a developing solution.

According to the present disclosure, the coating material layer isolates the water drops from the resist layer 120. When the quencher 124 is diffused into the coating material layer 130, it will be reacted with either the acid of the coating material 130 or a chelate compound such that the diffused quencher is neutralized, trapped, or transformed into a molecule with a reduced mobility and/or no quenching function. The further diffusion of the quencher into the water drops is thus reduced or eliminated. The coating material layer 130 with acid may further reduce photo generated acid diffusing out from the resist layer 120. As an example, the acid leached into the water drops may be less than about $10^{-9}$ mole/cm$^2$ during an immersion lithography. In various embodiments, the diffusion of the quencher to water drops is substantially reduced and the watermark is substantially reduced accordingly. Various embodiments may be modified or combined for optimized resist patterning process.

Figure 3:
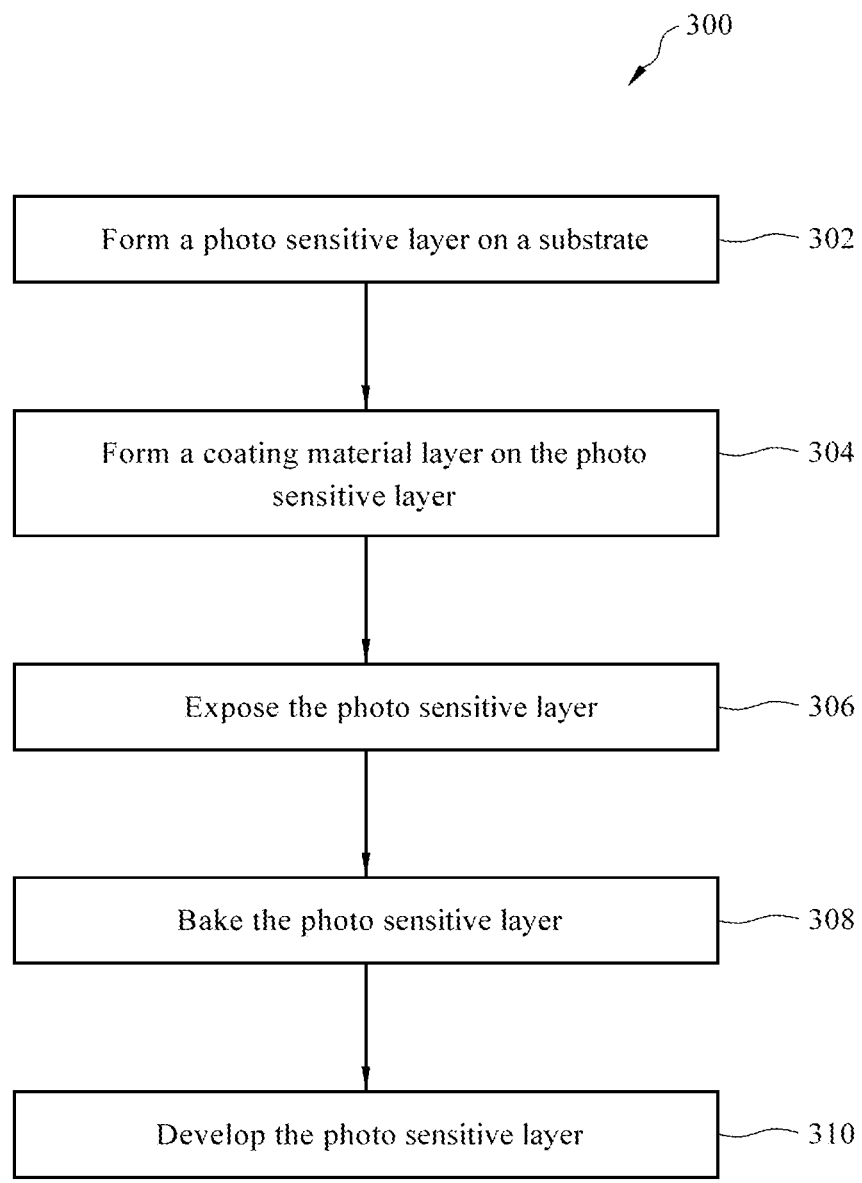
FIG. 3 is a flowchart of one embodiment of a method of immersion photolithography patterning.

Referring to FIG. 3, a flowchart of an immersion lithography method 300 to form a resist pattern is described. The method 300 includes a step 302 to form a photo sensitive (resist) layer on a semiconductor wafer. The resist layer is substantially similar to the resist layer 120 of FIG. 1.

The method 300 further includes a step 304 to form a coating material layer on the resist layer wherein the coating material layer may be substantially similar to the coating material layer 130 of FIG. 1. The coating material layer may include an acid or a chelate compound functioning as quencher catcher. The acid or chelate compound may be chemically bonded to a polymer of the coating material.

The method 300 further includes a step 306 to expose the resist layer to a radiation energy such as DUV through a photomask and an immersion fluid. The immersion fluid may be DIW or other suitable fluid having a high index of refraction, and is disposed between the semiconductor wafer and lens of an immersion lithography system to implement the method 300. Since the coating material layer is formed on the resist layer, the quencher has a reduced amount of leaching to water drops left on or over the coating material layer after the exposing step.

The method 300 then proceeds to a step 308 to bake (post exposure bake or PEB) the resist layer. The baking temperature may range between about 80° C. and 150° C. The baking may have a duration ranging from about 1 to 20 minutes in one example. The baking step may further serve to remove water drops.

The method 300 then proceeds to a step 310 to develop the resist layer in a developing solution. The exposed resist regions are substantially dissolved. The step 310 may further include a removal step to remove the coating material layer, separately from or combined with the developing process. For example, the coating material layer may be removed in the developing solution with the exposed resist material. The material and method are described using a positive resist as example and can be extended to a negative resist.

Thus in one embodiment, the present disclosure provides a coating material disposed over a photosensitive layer, for use during an immersion lithography process. The coating material includes a polymer that is substantially insoluble to an immersion fluid; and an acid capable of neutralizing a base quencher from the photosensitive layer.

In some embodiments, the coating material has a pH value below about 5. The acid may be chemically bonded to the polymer. The acid may be selected from a group consisting of an acid buffer chemical and an acid chemical. The acid may include an organic acid and/or an inorganic acid. The organic acid may include an organic acid functional group attached to one of an alkyl group and an aromatic group of the polymer. The organic acid may include a photo acid generator (PAG). The organic acid may include an organic acid functional group such as a carboxylic group, hydroxyl group, a thiol group, an enol group, a phenol group, a sulfonyl acid group, and/or a $SO_2OH$ group. The inorganic acid may include perchloric acid, hydrogen iodide, hydrogen bromide, hydrogen chloride, nitric acid, thiocyanic acid, chloric acid, iodic acid, hypophosphorous acid, hydrogen fluoride, nitrous acid, cyanic acid, hydrazoic acid, hypochlorous acid, hypobromous acid, hydrocyanic acid, hypoiodous acid, sulfuric acid, chromic acid, sulfurous acid, phosphoric acid, phosphorous acid, pyrophosphoric acid, carbonic acid, hydrogen sulfide, and/or boric acid. The polymer and acid structure may include fluoride. The coating material may be substantially soluble by a solution selected from the group consisting of a developing solution, a base solution, and a solvent. The base solution may include tetramethylammonium hydroxide (TMAH) solution. The solvent may include cyclohexanol, iso-butanol, or iso-pentanol. The coating material may include a multiple layer structure.

In another embodiment, a coating material is disposed over a photosensitive layer having a quencher capable of neutralizing acid during an immersion lithography process. The coating material includes a polymer that is substantially insoluble to an immersion fluid and either an acid capable of neutralizing the quencher from the photosensitive layer, or a chelate compound capable of bonding the quencher from the photosensitive layer, or both. The coating material may be designed to function as a top antireflective coating (TARC) layer. The chelate compound may be bonded to the polymer. The chelate compound may include a halogenalkane. The chelate compound may be capable of reacting with the quencher to form quaternary ammonium salts.

An embodiment of a method for immersion photolithography process is also disclosed. The method includes forming a photoresist layer on a substrate, the photoresist layer including a quencher capable of neutralizing acid. A coating material layer is formed over the photoresist layer, wherein the coating material layer includes: an acid capable of neutralizing the quencher from the photosensitive layer and a polymer that is substantially a carrier of the acid and is substantially insoluble to an immersion fluid. The method further includes exposing the photoresist layer through a patterned photomask and the immersion fluid using an immersion lens system. The immersion lens system may include a numerical aperture greater than about 0.85. The photoresist layer is baked and developed.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A coating material for use during a lithography process, wherein the coating material is disposed over a resist layer, the coating material comprising an acid that substantially neutralizes a quencher that diffuses into the coating material from the resist layer.

2. The coating material of claim 1 further comprising a polymer that is substantially a carrier of the acid.

3. The coating material of claim 2 wherein the polymer is substantially insoluble to a fluid used during the lithography process.

4. The coating material of claim 2 wherein the acid is chemically bonded to the polymer.

5. The coating material of claim 4 wherein the chemically bonded acid and polymer form a copolymer having an organic acid functional group.

6. The coating material of claim 5 wherein the organic acid functional group is a sulfonyl acid group.

7. The coating material of claim 1 wherein the coating material is substantially soluble in a base solution.

8. The coating material of claim 7 wherein the base solution is a tetramethylammonium hydroxide (TMAH) solution.

9. The coating material of claim 1 wherein the coating material is substantially soluble in a solvent.

10. The coating material of claim 9 wherein the solvent is one of cyclohexanol, butanol, iso-butanol, pentanol, and iso-pentanol.

11. A coating material for use during a lithography process, wherein the coating material is disposed over a resist layer, the coating material comprising a chelate compound that bonds with a quencher diffusing into the coating material from the resist layer.

12. The coating material of claim 11 further comprising a polymer.

13. The coating material of claim 12 wherein the polymer is substantially insoluble to a fluid used during the lithography process.

14. The coating material of claim 12 wherein the chelate compound is chemically bonded to the polymer.

15. The coating material of claim 11 wherein the chelate compound is a halogenalkane.

16. The coating material of claim 11 wherein the coating material has a pH value less than about 5.

17. The coating material of claim 11 wherein the chelate compound neutralizes a nitrogen of the quencher diffusing into the coating material from the resist layer.

18. An antireflective coating layer disposed on a material layer, the antireflective coating layer comprising:
   a polymer; and
   a quencher catcher chemically bonded to the polymer, wherein the quencher catcher substantially neutralizes any quencher that diffuses into the antireflective layer from the material layer.

19. The coating material of claim 18 wherein the quencher catcher is an acid.

20. The coating material of claim 18 wherein the quencher catcher is a chelate compound.

* * * * *